United States Patent [19]

Tago et al.

[11] Patent Number: 5,508,561
[45] Date of Patent: Apr. 16, 1996

[54] APPARATUS FOR FORMING A DOUBLE-BUMP STRUCTURE USED FOR FLIP-CHIP MOUNTING

[75] Inventors: Masamoto Tago; Kei Tanaka, both of Tokyo, Japan

[73] Assignee: NEC Corporation, Tokyo, Japan

[21] Appl. No.: 339,680

[22] Filed: Nov. 14, 1994

[30] Foreign Application Priority Data

Nov. 15, 1993 [JP] Japan .................................. 5-283797
Dec. 17, 1993 [JP] Japan .................................. 5-317587

[51] Int. Cl.$^6$ .................................. H01L 21/60; H01L 29/46
[52] U.S. Cl. ........................... 257/737; 257/778; 257/738
[58] Field of Search ........................... 257/734–741, 257/778–781, 738

[56] References Cited

U.S. PATENT DOCUMENTS

| | | | |
|---|---|---|---|
| 4,000,842 | 1/1977 | Burns | 257/737 |
| 4,263,606 | 4/1981 | Yorikane | 257/737 |
| 4,742,023 | 5/1988 | Hasegawa | 257/781 |
| 4,818,728 | 4/1989 | Rai et al. | 257/781 |
| 4,970,571 | 11/1990 | Yamakawa et al. | 257/766 |
| 5,289,631 | 3/1994 | Koopman et al. | 257/737 |

FOREIGN PATENT DOCUMENTS 1-143291  6/1989  Japan .

OTHER PUBLICATIONS

Y. Tomura et al., "Chip-On-Board Mounting Technology Using Stud-Bump-Bonding Technique", National Technical Report, vol. 39, No. 2, Apr. 1993, pp. 90–97.

"Flip Chip Mounting Using Stud Bumps and Adhesives for Encapsulation", Fujitsu, vol. 43, No. 7, Nov. 1992, pp. 773–778 with English–Language Abstract.

*Primary Examiner*—Robert P. Limanek
*Assistant Examiner*—Alexander Oscar Williams
*Attorney, Agent, or Firm*—Sughrue, Mion, Zinn, Macpeak & Seas

[57] ABSTRACT

A bump structure has a bump constituted by a metal projection which is formed on an electrode of a substrate, and a solder which covers the metal projection but does not touch the electrode. The metal projection is substantially spherical and has a projected portion at a center portion on an upper surface thereof. The metal projection is made of a metal having properties of solder diffusion prevention and adhesion to solder. The bump structure may have two bumps, the first bump being substantially the same as the bump described above and the second being such that its diameter is smaller than an outer diameter of the first bump and it covers the projected portion on the first bump. This bump structure can be formed using a simple process, and can be applied to flip-chip mounting in semiconductor devices with high reliability and yield.

20 Claims, 14 Drawing Sheets

FIG. 15
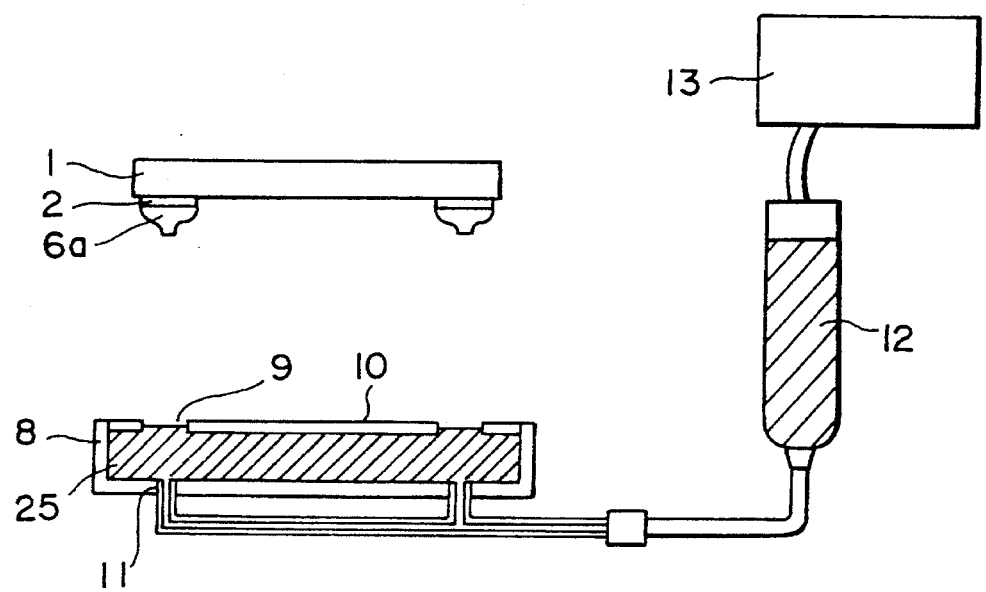
FIG. 16A  FIG. 16B  FIG. 16C
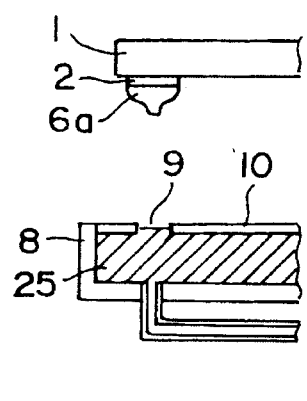 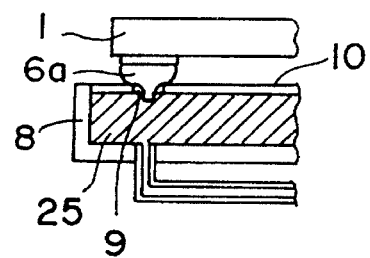 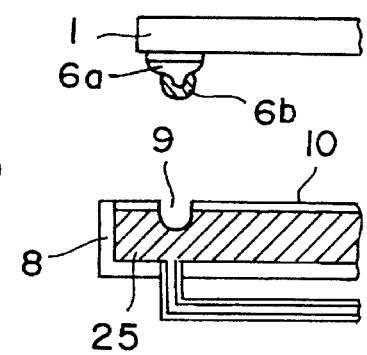

FIG. 17A    FIG. 17B    FIG. 17C
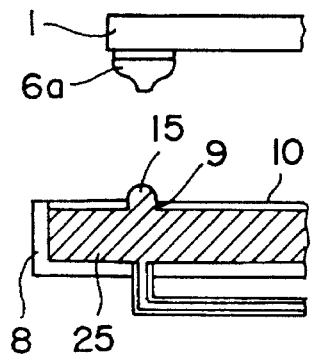
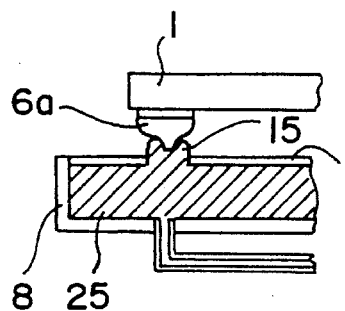
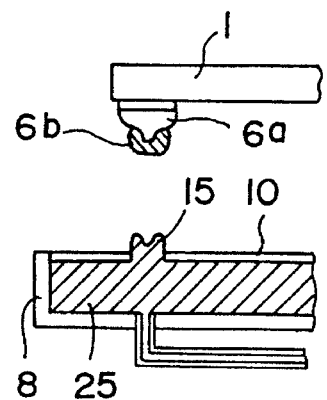
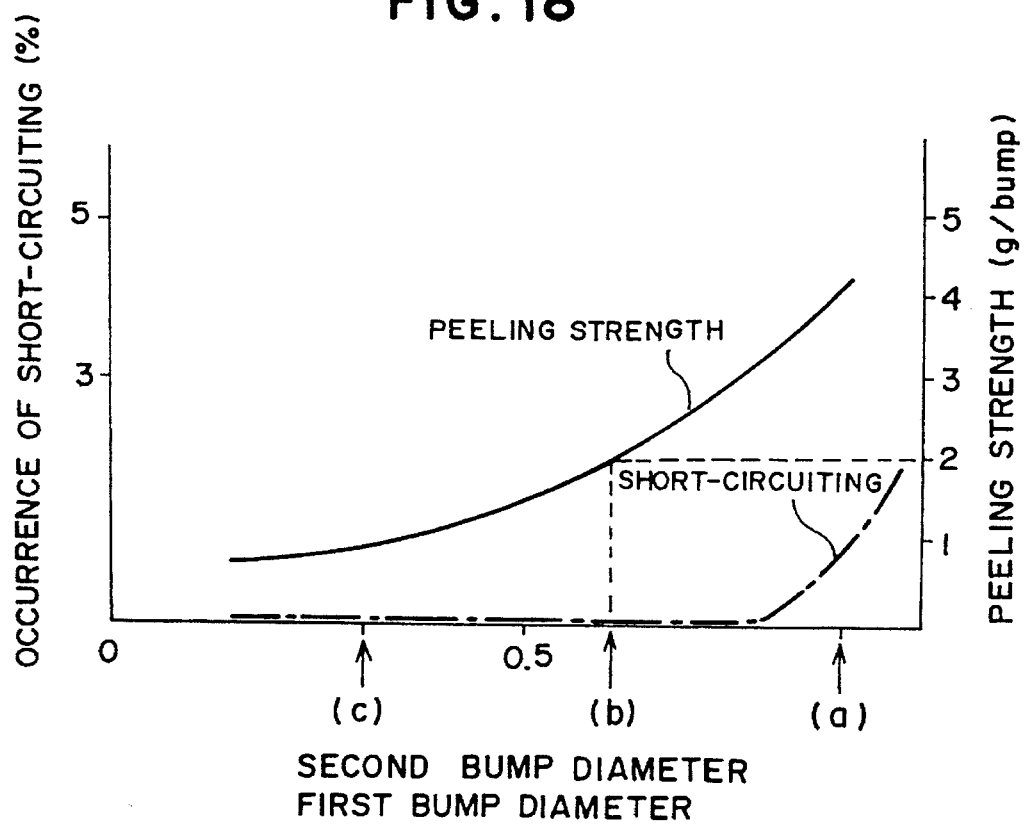
FIG. 18

APPARATUS FOR FORMING A DOUBLE-BUMP STRUCTURE USED FOR FLIP-CHIP MOUNTING

BACKGROUND OF THE INVENTION

1. Field of the Invention

The present invention relates to a bump structure provided on a substrate of such element as a semiconductor element, and more particularly to a bump structure, a method and an apparatus for forming such a bump structure, and a bump structure used for flip-chip mounting.

2. Description of the Related Art

A bump structure formed using a solder 5 in a conventional manner is shown in a diagrammatic cross sectional view in FIG. 1C. On an Al electrode 2 of a semiconductor element 1, a Cr layer is formed as a bonding layer 72 and a Cu, Ni layer is formed as a diffusion prevention layer 73. On the diffusion prevention layer 73, there is a bump of solder 5 in a spherical form. The solder 5 has a composition of Pb 95%-Sn 5% or a eutectic composition. A passivation film 3 is provided on the semiconductor element 1, and has an opening at the portion where the Al electrode 2 of the passivation film 3 is disposed. FIGS. 1A and 1B are sectional views showing sequential steps of forming the bump structure shown in FIG. 1C. A metal mask 71 is positioned over the Al electrode 2 of the semiconductor element 1 in its wafer state, and the sequential sputtering is performed for the Cr layer as the bonding layer 72 and the Cu, Ni layer as the diffusion prevention layer 73, followed by the vapor deposition of the Sn and Pb with the composition necessary for the solder 5—(FIG. 1A). Then, the metal mask 71 is removed (FIG. 1B), the solder 5 is heated to its melting point and, after the solder 5 is shaped spherically due to its surface tension, the resulting structure is diced and divided into IC pellets mountable as flip chips.

FIG. 2 shows another conventional bump structure in a state in which it is connected to an electrode 52 of the wiring substrate 51 by a conductive resin 62. This bump structure is formed by a wire bonding technique and is called "stud bump" 63 (disclosed in National Technical Report Vol. 39, No. 2, April 1993 published by Matsushita Electric Industrial Co., Ltd.) which is a double stepped structure and in which an Au ball is formed at a leading end of a bonding wire in a loop form. FIGS. 3A–3D are sectional views for explaining sequential steps of forming the stud bump 63. As shown in FIG. 3A, the Au ball is first formed at the leading end of the bonding wire 21. Then, through a capillary 22 and by an ultrasonic incorporated thermo-compression means, the Au ball is compressed to the Al electrode 2 of the semiconductor element 1 as seen in FIG. 3B, whereby the bottom part of the stud bump is formed. Thereafter, the capillary 22 is moved along a locus 25 forming a loop shown in FIG. 3C and, as the capillary 22 is moved downward as shown in FIG. 3D, the bonding wire 21 is second-bonded to the bottom part of the stud bump and is cut, whereby the leading end is formed on the upper surface of the bottom part of the stud bump.

Next, for the flatness and the height uniformity of the upper surface, the resulting stud bump 63 is subjected to leveling by applying pressure with a flat surface on the upper surface of the stud bump 63. By applying a pressure of about 50 g/bump, it is possible to make the heights of the bumps uniform with high precision.

FIGS. 4A–4C show the steps of a conventional method in which the bumps are formed. FIG. 4A shows that a film of conductive resin 62 is formed in advance to the thickness about half the height of the bumps 63 on a transfer base 65. The tip portions of the stud bumps 63 are pressed into the film of conductive resin 62 (FIG. 4B) and, when raised, the conductive resin 62 touched are transferred simultaneously onto all of the tip portions of the stud bumps 63 (FIG. 4C). Then, as shown in FIG. 5, the semiconductor element 1 is turned upside-down and is mounted on the wiring substrate 51. Upon completion of the mounting, the conductive resin 62 is cured, and the gap between the semiconductor element 1 and the wiring substrate 51 is shielded with resin 53.

FIGS. 6A–6C show the steps of a conventional method in which a conductive resin material is provided on the bump 6a. FIG. 6D shows a semiconductor chip which has been mounted on the wiring substrate by utilizing the bumps.

FIG. 6A shows that the bump 6a is formed on the Al electrode 2 of the semiconductor chip 1. As shown in FIG. 6B, a conductive resin film 7 having a thickness of 20–30 µm is formed on a flat glass base 21, and the bump 6a of the semiconductor chip 1 is pressed into the conductive resin film 7 (FIG. 6B). When the semiconductor chip 1 is raised, the conductive resin film 7 touched is transferred onto the tip portion of the bump 6a (FIG. 6C). The conductive resin material 22 thus adhered to the tip portion has a diameter the same as or larger than that of the bump 6a. When the semiconductor chip 1 is pressed against the conductive resin film 7 on the glass base 21, the conductive resin film 7 surrounding the periphery of the bump 6a is caused to form a raised portion 23 and, depending on the magnitude of this raised portion, there arise variations in the quantity of the conductive resin material 22 that adheres to the bump 6a.

As shown in FIG. 6D, when the semiconductor chip 1 is mounted on the wiring substrate 5, the resin material 22 that adheres on the bump 6a spreads out on the wiring substrate 5, whereby the semiconductor chip 1 and the wiring substrate 5 are mechanically and electrically connected.

FIG. 7 shows another conventional method of attaching a conductive resin material on a bump, which is disclosed in Japanese Patent Application Kokai Publication No. Hei 1-143291. According to this method, a conductive resin material 7 is filled-in advance in an opening 9 of a metal mask 10 and, after this opening 9 is brought into registry with the bump 6a of the semiconductor chip 1, the compressed air is ejected from a guided air opening 24, thereby causing the conductive resin material 7 to adhere to the bump 6a.

The problems existed in the structures resulted from the conventional methods explained above include the following.

For the conventional structure explained with reference to FIGS. 1A–1C, since such layers as the bonding layer 72 and the solder diffusion prevention layer 73 are formed on the Al electrode 2 of the semiconductor element 1 by such methods as plating and vacuum deposition, the number of steps and the cost for such process are unavoidably increased. The plating method and the vacuum deposition method require a great investment in plant and equipment Also, for the conventional structure explained with reference to FIGS. 3A–3D, since the formation of the wire loop is involved, the material that can be applied is limited to Au which is comparatively soft. Thus, between Au and Sn, a brittle compound metal is formed, and this cannot be used for the solder connection for the reasons of reliability. In the bump formation method, when the loop is formed, the wire tends to be loosened during the capillary driving because the diameter of the Au wire is smaller than the inner diameter of the tip of the capillary, and it is not possible to obtain uniform shapes of the loop. Also, depending on a lack of locational precision of the bonding device, there will be variations in the orientation of loops. Furthermore, the leveling which is made to make the heights of the bumps uniform will cause the bumps to be greatly deformed in a lateral direction. Thus, the amount of the conductive resin supplied will be varied so that, after the flip chip mounting, there may occur wire breakage or short-circuiting due to shortage of the solder or conductive resin. Also, the fact that the leveling is an additional step means that there is an increase in the cost of fabrication.

In the bump structure of the conventional semiconductor chip explained with reference to FIGS. 6A–6D, the diameter of the conductive resin material 22 that adheres to the bump 6a on the Al electrode 2 of the semiconductor chip 1 is either substantially the same as or larger than that of the bump 6a. This is because the bump 6a is submerged directly into the conductive resin film 7. When the resulting semiconductor chip 1 is connected to the substrate electrode 26, the conductive resin material 22 spreads out further so that, where the substrate electrodes 26 are provided with narrow pitches, the electrodes adjacent to one another may easily suffer from short-circuiting problems due to the spread-out conductive resin 22. Also, where the semiconductor chip 1 is to be exchanged due to defects therein, the problem attendant is that, since the area in which the conductive resin material 22 is attached is large, a damage may be caused to occur when the semiconductor chip 1 is separated from the wiring substrate 5 both in the substrate electrode 26 and the semiconductor chip 1.

In the conventional method explained with reference to FIG. 7, the problem attendant is that, since the conductive resin material that adheres to the bump 6a spreads into and around the side of the bump 6a, it is difficult to attach the conductive resin material on the bump 6a in a uniform and stable manner.

SUMMARY OF THE INVENTION

An object of the present invention is to overcome the problems existed in the prior art and to provide an improved bump structure on an electrode of a semiconductor element, a method and an apparatus for forming such a bump structure, and a flip-chip mounting structure. According to the invention, the bump can be easily formed on an Al electrode of the semiconductor element, and the bump structure thus formed enables to enhance the yield when used for flip-chip mounting.

According to a first aspect of the invention, there is provided a bump structure comprising:

a metal projection a lower surface of which is fixed to an electrode of a substrate, which is substantially spherical and has a projected portion at a center portion on an upper surface thereof, and which is made of a metal having properties of solder diffusion prevention and of adhesion to solder; and a solder which is semi-spherical and is configured such that it covers an upper portion of the metal projection but does not touch the electrode.

A flip-chip connecting structure according to the invention comprises:

a metal projection a lower surface of which is fixed to a first electrode of a first substrate, which is substantially spherical and has a projected portion provided at a center portion on upper surface thereof, the projected portion having its tip portion connected to a second electrode of a second substrate, and which is made of a metal having properties of solder diffusion prevention and of adhesion to solder; and a solder which is configured such that it interconnects the second electrode and the metal projection but does not touch the first electrode.

A method of forming the bump structure according to the invention includes the steps of:

forming a metal ball at a tip of a wire passing through a hole of a capillary;

forming a metal projection by causing the capillary to press the metal ball to an electrode of a substrate, the metal projection being substantially spherical and having its lower portion fixed to the electrode, and having a projected portion at a center portion on an upper surface thereof;

cutting off the wire from the metal projection by causing the capillary to move away once from the metal projection and a tip of the projected portion to be pressed at an end face of a tip of the capillary; and supplying solder on the metal projection, the solder being melt and solidified, whereby the bump is formed in a semi-spherical form such that the metal projection is covered but the electrode is not touched thereby.

According to a second aspect of the invention, there is provided a bump structure comprising:

a first bump made of a conductive material, a lower surface of which is fixed to an electrode of a substrate, and which is substantially spherical and has a projected portion at a center portion on an upper surface thereof;

a second bump made of a conductive material, which covers the projected portion on the first bump and which has a diameter smaller than an outer diameter of the first bump.

A method of forming the second bump according to the invention includes the steps of:

placing a mask which is in contact with a liquid surface of the second conductive material and which has an opening located at a position corresponding to that of the first bump and having a diameter smaller than the outer diameter of the first bump; and causing the second conductive material to adhere to a tip end of the first bump by causing the projected portion to be inserted into the opening, pressing the first bump to the mask, and raising the substrate for the first bump to move away from the liquid surface of the second conductive material, thereby forming the second bump on the first bump.

For the structure resulting from the features of the first aspect of the invention explained above, the advantages include the following:

With the bump structure according to the invention, since the metal projection provided on an electrode of the substrate has a solder diffusion prevention effect and a solder adhesion effect and the upper part of the metal projection is covered by solder, there is no need to provide a solder diffusion prevention layer or an adhesive layer which, when the electrode of one substrate is connected by solder to an electrode of another substrate, may be required to be formed by a plating or a vacuum vapor phase deposition method. Thus, the Al electrode of a semiconductor element for which the wire bonding method is currently being used can be used as it is, and this saves the otherwise very high investment for equipment such as plating or vacuum vapor phase deposition equipment, and this in turn reduces the number of process steps and the manufacturing cost.

In the method of forming the bump structure, the process does not involve a number of process steps such as for forming loops of bonding wires. Also, since the heights of the metal projections are made uniform for cutting wires, the process does not involve the leveling step which is otherwise necessary. These contribute to the cost saving. Furthermore, since the leveling is not involved, the metal projections deform little in a lateral direction, and this ensures the stable shapes of the metal projections. Thus, when the conductive resin is transferred onto the metal projections, there are no variations in the amount of the resin transferred and in the heights of the solder supplied onto the metal projections. For these reasons, when, for example, the semiconductor substrate employing the bump structure according to the invention is used for flip-chip mounting, there does not occur a wire breakage caused by a shortage of the conductive resin material or solder, or a short-circuiting caused by an excess of the conductive resin material or solder, whereby a high production yield is enhanced.

Furthermore, due to the projected portion at a center of the surface of the metal projection, the solder or the conductive resin material is prevented from being squashed, even when subjected to a force of excess pressure or of its own weight during the flip-chip mounting operation, so that there is no possibility for the solder on the adjacent bumps to be short-circuited.

Also, since no formation of loops of bonding wires is involved, the wire material for forming the metal projection 4 can be selected from among materials whose rigidity is comparatively high, such as Cu, Pd, etc., and the connection made using solder ensures high reliability.

For the structure resulting from the features of the second aspect of the invention explained above, the advantages include the following:

Since the structure is such that there is no possibility for any short-circuiting to occur with the electrodes adjacently located on the substrate, the structure is adapted to applications wherein the pitches of the electrodes are required to be narrow.

Where a semiconductor chip is to be exchanged due to a defect therein, since the area which the deformed second bump occupies is small, any damage which, for example, the removal of the semiconductor chip may cause to the substrate electrode and the semiconductor chip can be made minimal. Also, when the semiconductor chip is removed, the amount of the second bump that may remain on the wiring substrate is small so that the removal process is made easy.

Also, the method of forming the bump structure according to the second aspect of the invention ensures that the second bump can be formed easily and stably with the volume thereof being constant.

Further, in the method of forming the bump structure, since the second conductive material is not exposed to the air except at the openings of the metal mask, the solvent in the case where the second conductive material is conductive resin does not readily evaporate so that the properties thereof including a viscosity do not undergo changes.

A further advantage is that, since the second bumps are formed through the metal mask openings, the material of the second bumps does not adhere to other portions of the semiconductor chip, and this prevents producing otherwise defective semiconductor chips.

BRIEF DESCRIPTION OF THE DRAWINGS

The above and other objects, features and advantages of the present invention will be apparent from the following description of preferred embodiments of the invention explained with reference to the accompanying drawings, in which:

FIG. 15 is a diagram for showing an apparatus for forming the bump structure of the second embodiment according to the invention;

FIGS. 16A–16C are diagrams for showing the sequential steps in a process for forming the bump structure of the second embodiment according to the invention;

FIGS. 17A–17C are diagrams for showing the sequential steps in another process for forming the bump structure of the second embodiment according to the invention;

FIG. 18 is a graph for showing a relationship between the diameters of the second bump and the adherence characteristics in the second embodiment shown in FIGS. 14A–14D.

PREFERRED EMBODIMENTS OF THE INVENTION

Now, preferred embodiments of the invention are explained with reference to the drawings.

Figure 1A:
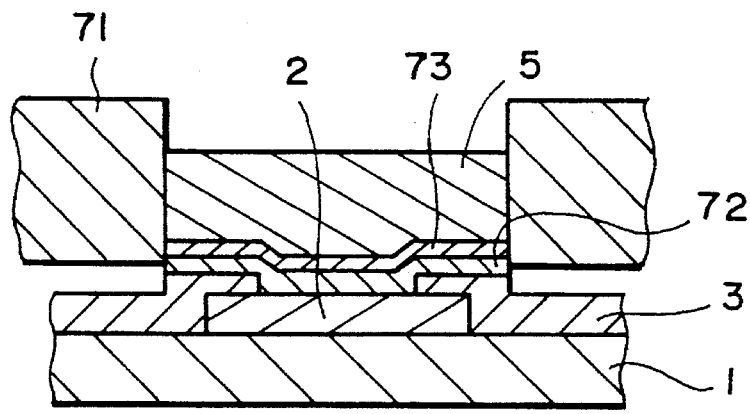
FIGS. 1A–1C are diagrammatic sectional views for showing steps for forming a conventional bump structure.
Figure 1B:
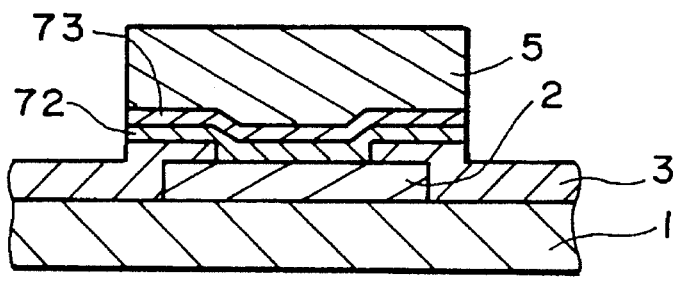
Figure 1C:
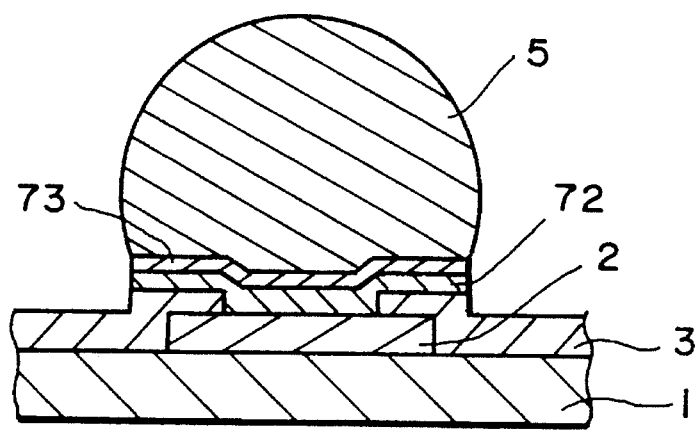
Figure 2:
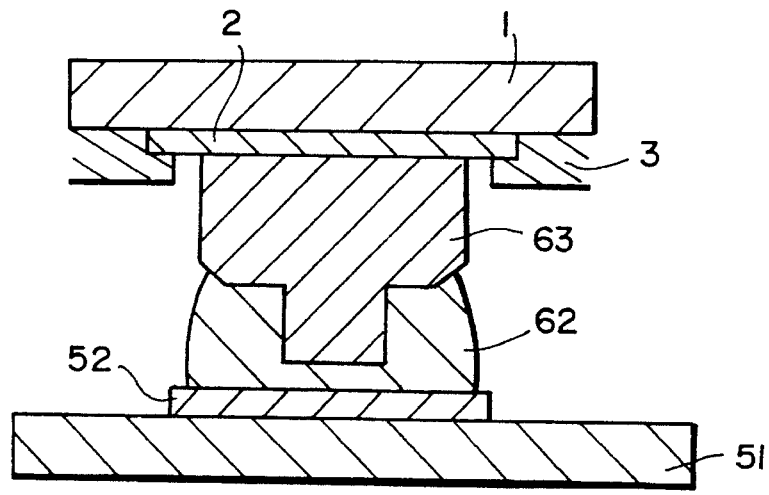
FIG. 2 is a schematic sectional view for showing a conventional bump structure.
Figure 3A:
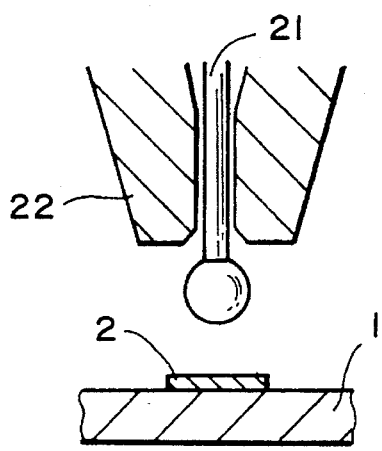
FIGS. 3A–3D are diagrams, partly in sectional views, for showing sequential steps in a process for forming the conventional stud bump structure shown in FIG. 2.
Figure 3B:
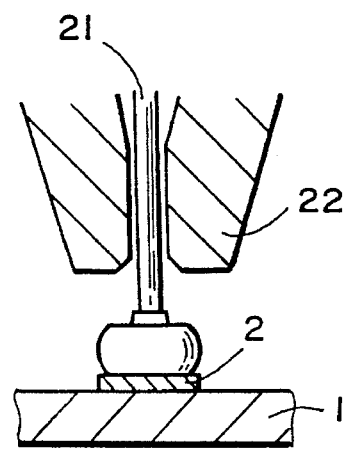
Figure 3C:
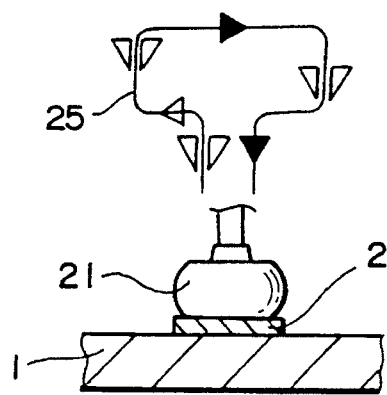
Figure 3D:
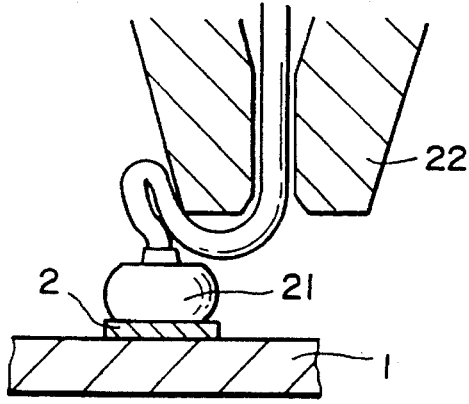
Figure 4A:
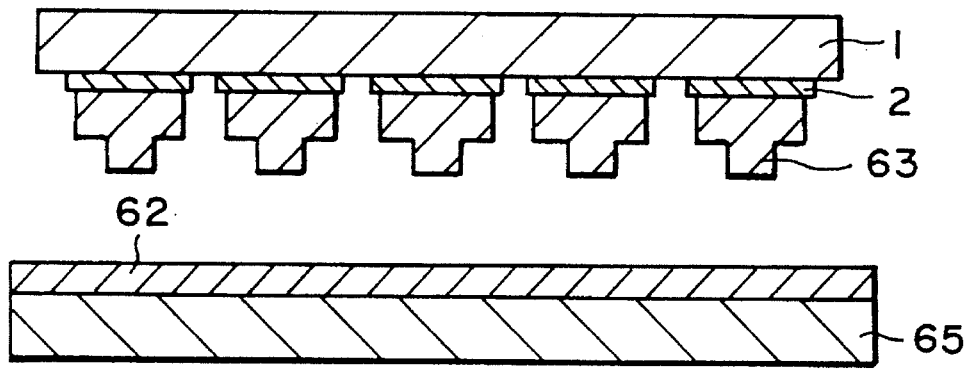
FIGS. 4A–4C are diagrammatic sectional views for showing a conventional process for transferring conductive resin onto stud bumps.
Figure 4B:
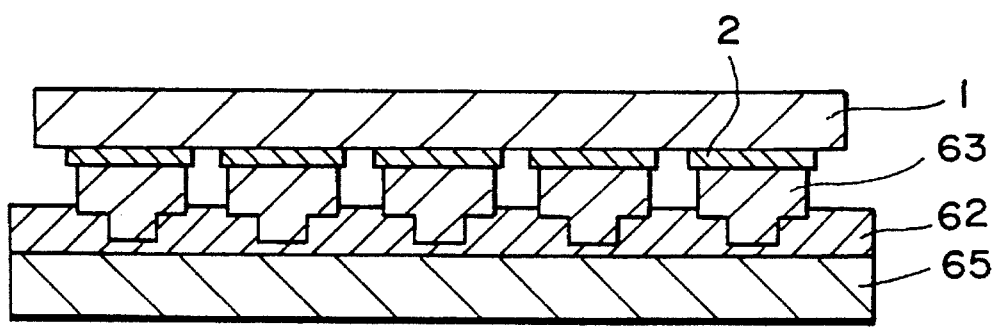
Figure 4C:
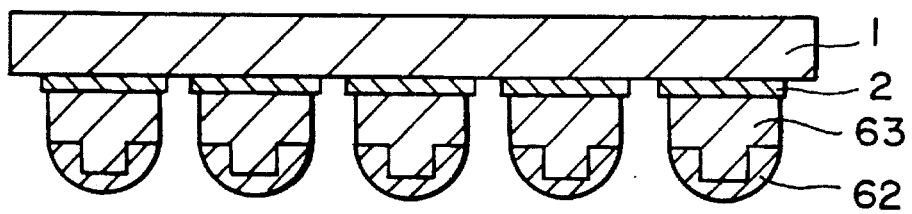
Figure 5:
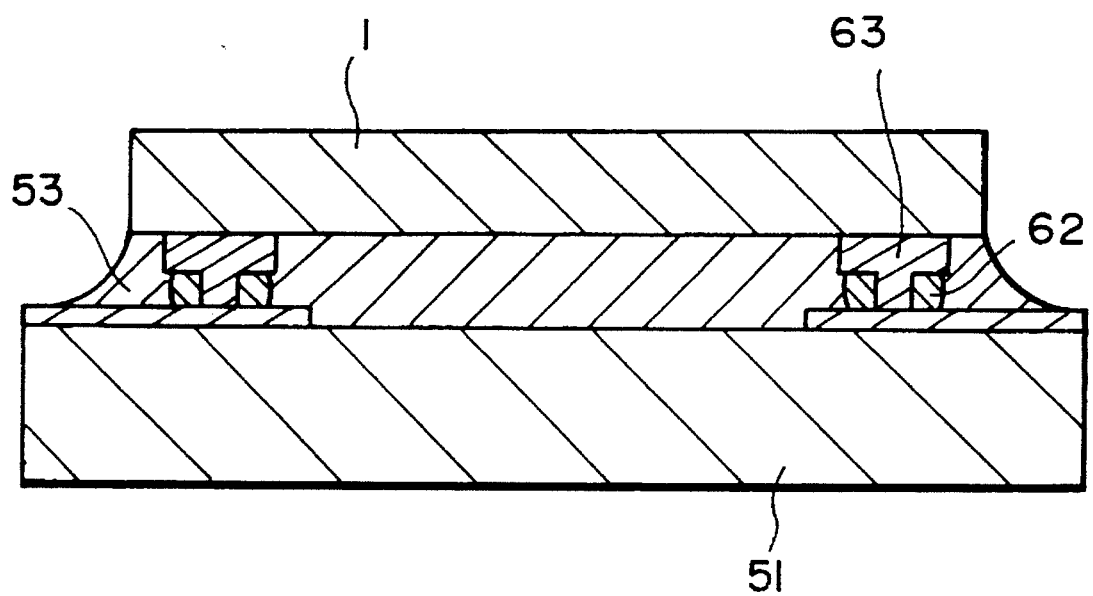
FIG. 5 is a diagrammatic sectional view for showing a conventional flip-chip mounted structure using the conventional bump structure shown in FIG. 2.
Figure 7:
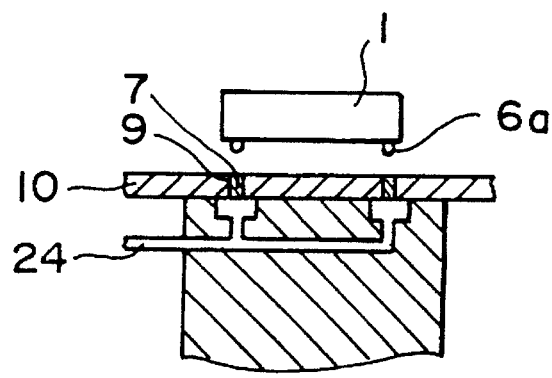
FIG. 7 is a diagram for use in explaining a process for forming still another conventional bump structure.
Figure 6A:
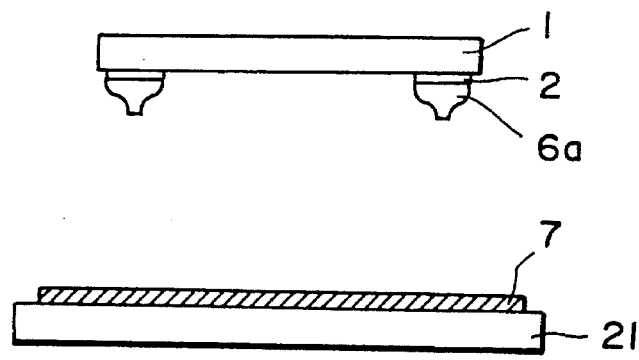
FIGS. 6A–6C are diagrams, partly in sectional views, for showing sequential steps in a process for forming another conventional bump structure.
Figure 6B:
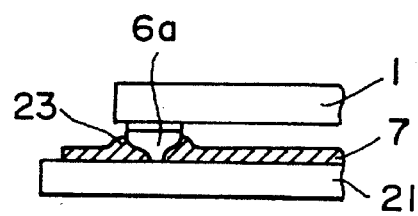
Figure 6C:
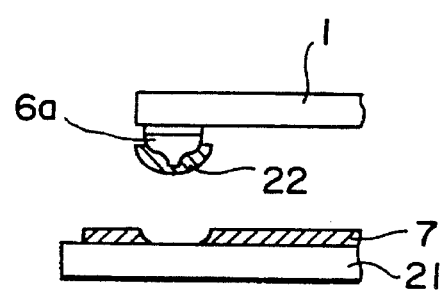
Figure 6D:
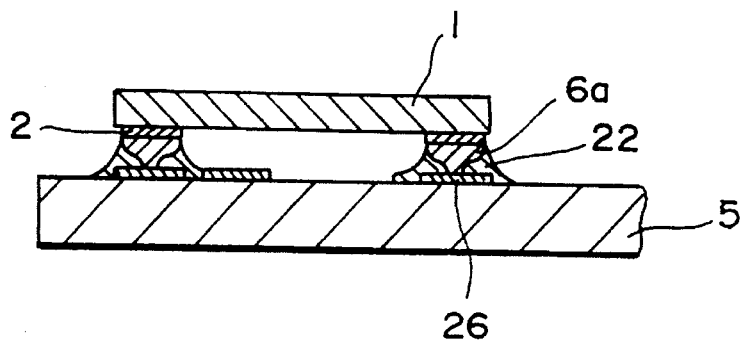
FIG. 6D is a diagram, in a sectional view, for showing a state in which a conventional bump structure is connected to a substrate electrode on a wiring substrate.
Figure 8A:
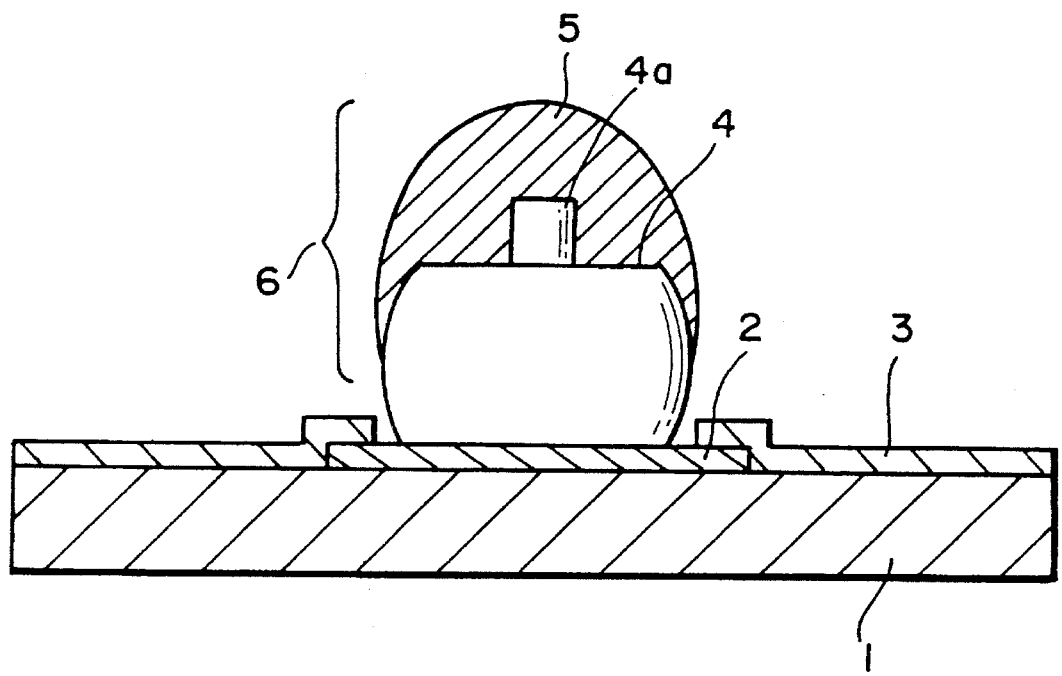
FIGS. 8A and 8B are diagrammatic sectional views each for showing a bump structure of a first embodiment according to the invention.
Figure 8B:
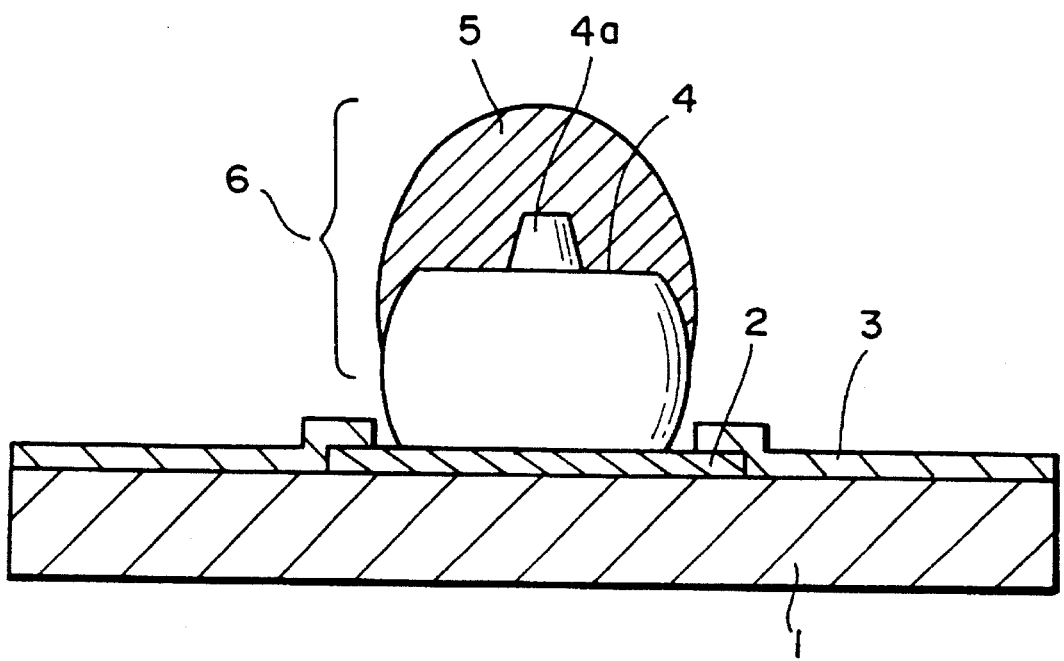

FIGS. 8A and 8B show in diagrammatic sectional views a bump structure of a first embodiment according to the invention. As shown therein, a bump 6 has a horizontal top surface which is parallel to an Al electrode 2 on a semiconductor element 1, and comprises a metal projection 4 which is substantially in a spherical form and which has at a center portion of the horizontal top surface a projected portion 4a in a cylindrical form as shown in FIG. 8A or in a truncated cone form as shown in FIG. 8B, and a solder 5 of a predetermined amount which is soldered on a top portion of the metal projection 4. The solder 5, without extending to a boundary between the metal projection 4 and the Al electrode 2, leaves ⅓ of the side surface of the metal projection 4 unwet.

Figure 9A:
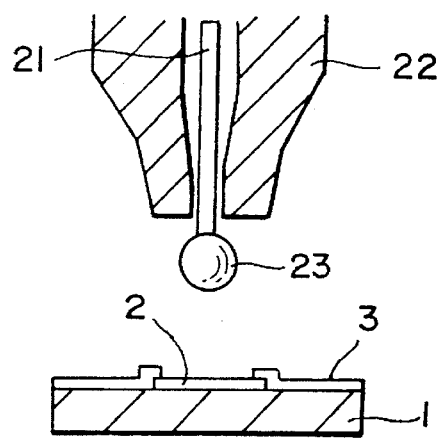
FIGS. 9A–9F are diagrammatic sectional views for showing the sequential steps in a process of forming a metal projection shown in FIG. 8A.
Figure 9B:
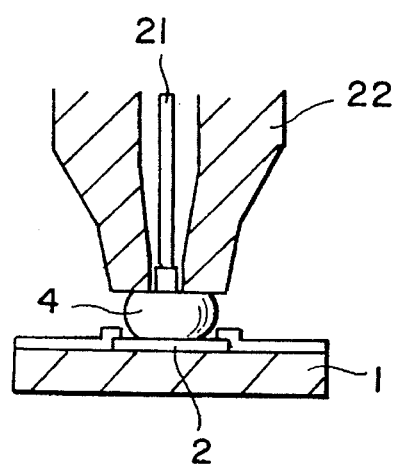
Figure 9C:
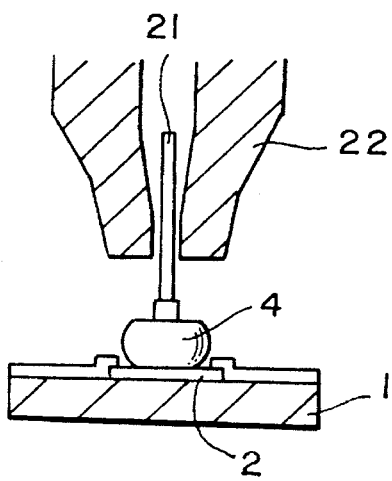
Figure 9D:
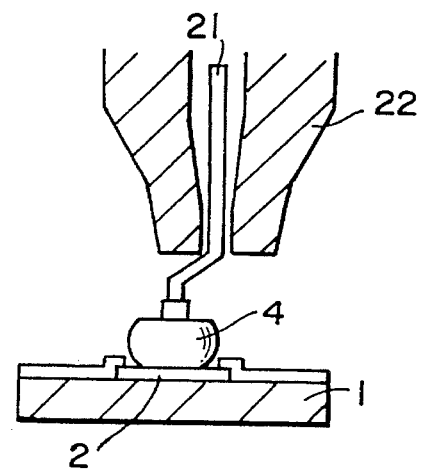
Figure 9E:
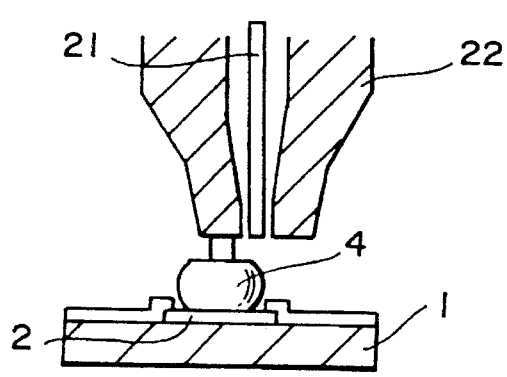

FIGS. 9A–9F show sequential steps in a process of forming the metal projection 4. A copper (Cu) bonding wire 21 having a diameter of 25 μm is put through a capillary 22 whose diameter at a hole end is 33 μm, whereby a Cu ball having a diameter of 80 μm is formed in a gas atmosphere containing a reduction gas (FIG. 9A). Then, after the capillary 22 is brought into registry with the Al electrode 2 of the semiconductor element 1 which is heated to 200° C. on a heated stage, the Cu ball is pressed by a load of 50 g and, by making combined use of ultrasonic waves, the Cu ball is caused, while being deformed, to adhere to the Al electrode 2, whereby the Cu metal projection 4 is formed (FIG. 9B).

Figure 9F:
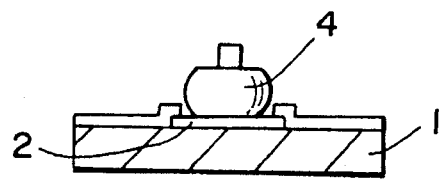

Thereafter, the capillary 22 is raised by 110 μm (FIG. 9C) and is moved laterally by 35 μm (FIG. 9D) so that a flat surface of the tip end portion of the capillary 22 is brought to a position corresponding to the center of the Cu metal projection 4 adhered to the Al electrode. Upon completion of this movement, the capillary 22 moves downward whereby the flat surface of the tip end portion of the capillary 22 together with the Cu bonding wire 21 is pressed towards the metal projection 4 (FIG. 9E) so that the Cu bonding wire alone is deformed. In this state, the Cu bonding wire 21 is deformed between the capillary 22 and the metal projection 4 so as to be in an easily breakable state. When the capillary 22 returns to the original position, the Cu bonding wire 21 is broken whereby the metal projection 4 is formed on the Al electrode 2 of the semiconductor element 1 (FIG. 9F).

In the metal projection 4 thus formed, the shear strength is 65 g/bump and, as to the shape thereof, the diameter of the ball after the deformation is 90 μm, the height up to the horizontal surface is 35 μm, and the diameter and the height of the cylindrically projected portion on the horizontal surface are 33 μm and 15 μm, respectively. In this embodiment, the projected portion on the horizontal surface is shaped cylindrical, but this may be conically shaped, which can be achieved by changing the shape of the tip end portion of the capillary 22.

Figure 10A:
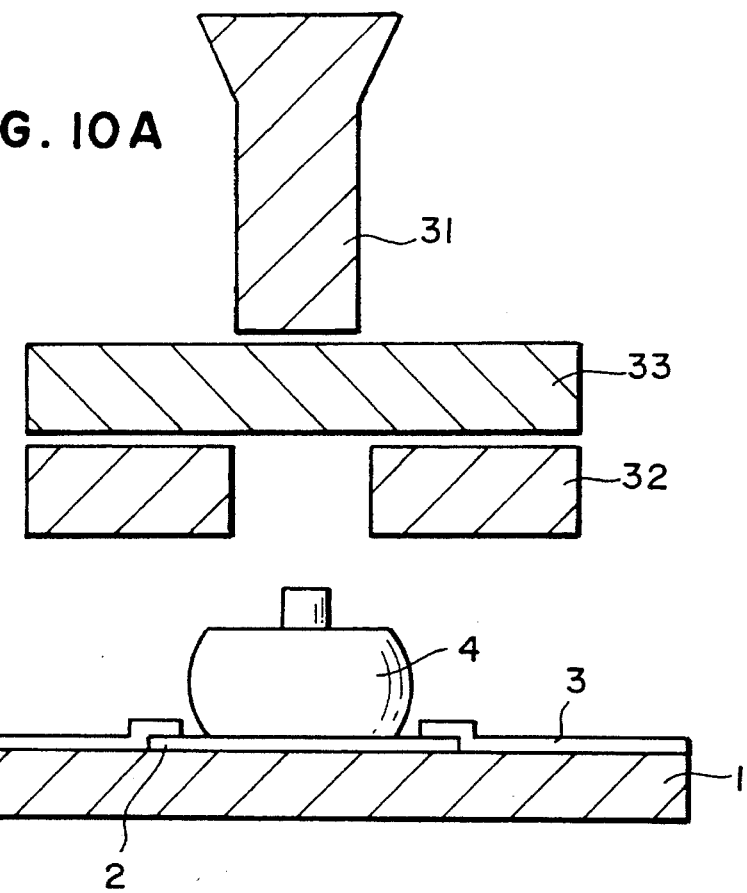
FIGS. 10A–10C are diagrammatic sectional views for showing the sequential steps in a process of forming a solder on the metal projection shown in FIG. 8A.
Figure 10B:
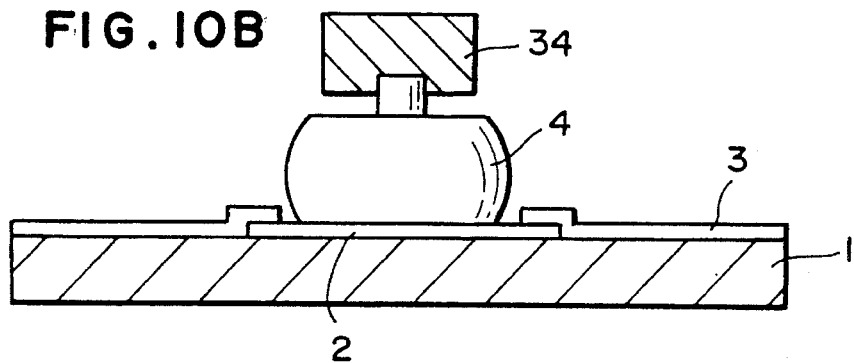
Figure 10C:
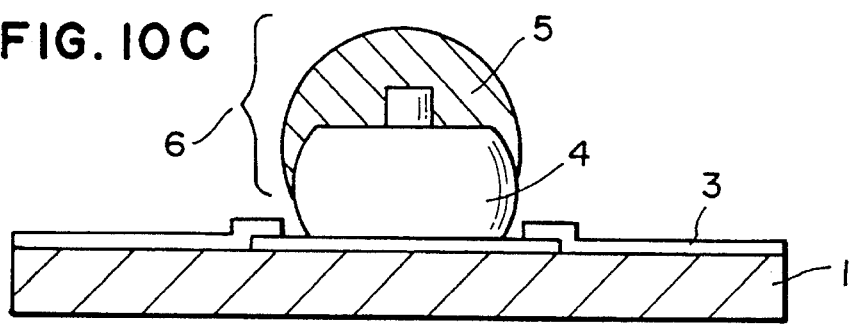

FIGS. 10A–10C show in diagrammatic sectional views sequential steps of a process for supplying solder to the metal projection 4 to form a solder 5 on the metal projection 4. On the metal projection 4 formed on the semiconductor element 1, a punch 31 with a diameter of 60 μm and a die 32 with an aperture diameter of 70 μm are positioned, and a eutectic solder foil 5 finished in 50 μm thick is placed on the die 32 (FIG. 10A). The punch 31 moves down and the solder piece 34 is punched out. The solder piece 34 is pressed and provisionally placed on the metal projection 4 formed on the electrode 2 of the semiconductor element 1 (FIG. 10B). This is then heated in the $N_2+4\%H_2$ mixed reducing gas at the temperature of 210° C. for thirty seconds, whereby the eutectic solder piece 34 melts and the solder 5 which is substantially semi-spherical is formed on the Cu metal projection 4 (FIG. 10C).

Figure 11A:
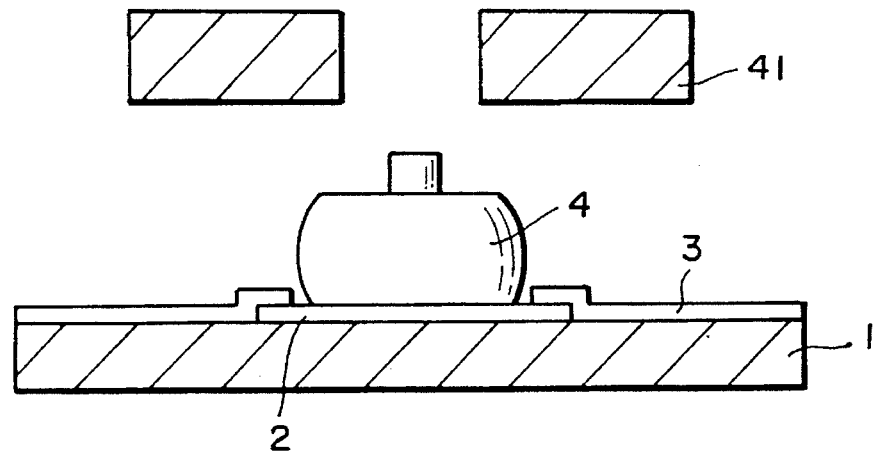
FIGS. 11A–11C are diagrammatic sectional views for showing the sequential steps in another process of forming a solder on the metal projection shown in FIG. 8A.
Figure 11B:
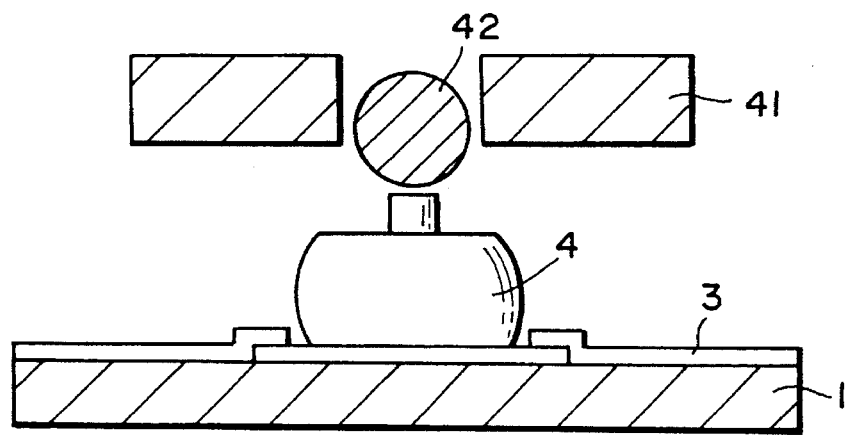
Figure 11C:
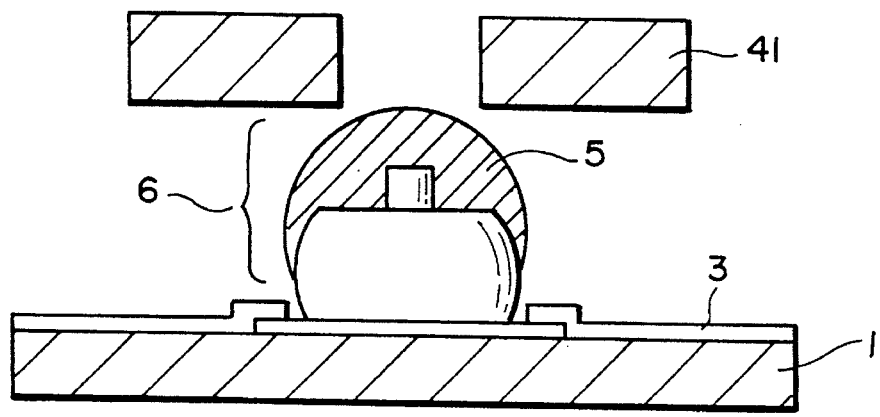

In this embodiment, the supply of the solder 5 employs a press technique. However, as shown in FIGS. 11A–11C, it is possible to use a technique wherein a through-hole provided in a solder ball guiding jig 41 is aligned to the electrode 2 of the semiconductor element 1 (FIG. 11A), a solder ball 42 having a predetermined diameter is dropped into the through-hole, and the solder ball 42 is subjected to heating in the state in which the solder ball 42 is positioned on the metal projection 4, whereby the solder ball 42 is caused to melt and form the solder 5.

However, the supplying amount of the solder 5 must be precise and is critical. If the amount is excessive, the solder 5 spreads and flows, due to its own weight, to the boundary between the Cu metal projection 4 on the semiconductor element 1 and the Al electrode 2 of the semiconductor element 1, and this leads to breakdown of the semiconductor element 1 or deterioration in the adhesive strength of the bump 6. For this reason, it is necessary to maintain a high precision in supplying the solder 5. The amount of the solder supply is optimum if, assuming that the diameter of the spherically formed solder equals the diameter of the Cu metal projection 4, the spherical volume of the solder is made ½ the volume thus assumed. With the size of the Cu metal projection 4 exemplified in this embodiment, in the case where the press jig is used as in FIGS. 10A–10C, the solder supply is optimum when the diameter of the punch 31 is 60 μm, the aperture diameter of the die 32 is 70 μm, and the thickness of the solder foil 33 is 50 μm while, in the case where the solder ball guiding jig 41 is used, the diameter of the ball is 36 μm.

In this embodiment, the bump 6 is constituted by the Cu metal projection 4 and the eutectic solder 5, but the metal projection 4 may be made of a metal having properties of solder diffusion prevention and of adhesion to solder such as a material whose main component is Cu, Pd or a material whose main component is Pd, and the solder 5 may be of a compound metal of Sn and Pb or Sn and Ag. Also, for the solder 5, use may be made of a conductive resin material, especially, an epoxy resin in which Ag is mixed or metal particles containing 1~5 wt % Pd in Ag are mixed.

Figure 12:
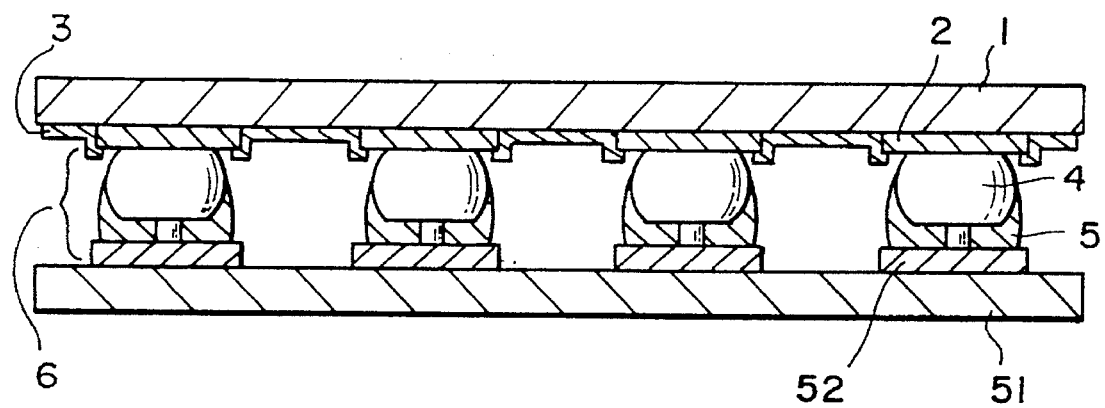
FIG. 12 is a diagrammatic sectional view for showing a flip-chip mounted structure using the bump structure shown in FIG. 8A.
Figure 13A:
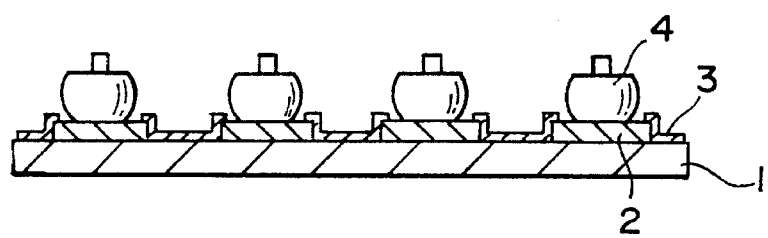
FIGS. 13A–13C are diagrammatic sectional views for showing the sequential steps in a process of flip-chip mounting shown in FIG. 12.
Figure 13B:
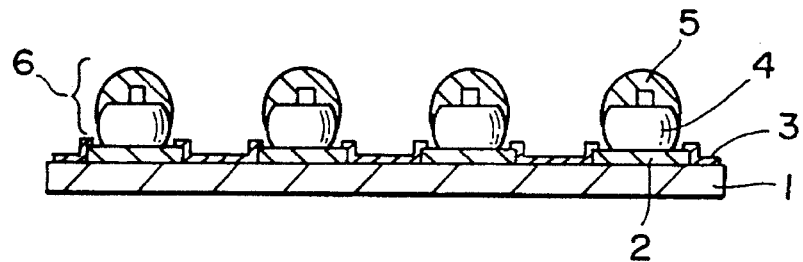
Figure 13C:
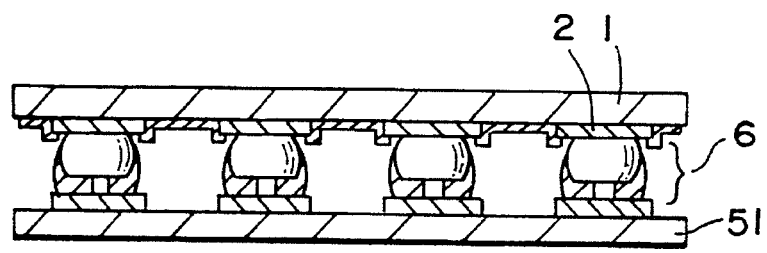

FIG. 12 shows in a sectional view a flip-chip mounting structure for the mounting on a wiring substrate 51 of the semiconductor element 1 provided with the bumps 6. FIGS. 13A–13C are sectional views for showing steps in the flip-chip mounting process. As shown therein, the Cu metal projections 4 are formed on the Al electrodes 2 of the semiconductor element 1 (FIG. 13A), and the eutectic solders 5 in predetermined amounts are supplied on the metal projections 4 and are subjected to heating, whereby the bumps 6 are formed (FIG. 13B). Then, the electrodes 2 of the wiring substrate 51 in which the semiconductor element 1 is turned upside-down and the bumps 6 are brought into the aligned positions. While the wiring substrate 51 is being heated to a temperature above the melting point of the eutectic solders 5, the semiconductor element 1 is moved downwardly. The downward movement continues until the cylindrically projected portions formed on the horizontal surfaces of the Cu metal projections 4 on the electrodes 2 of the semiconductor element 1 touch electrodes 2 of the wiring substrate 51. In this way, the soldering of the solders 5 onto the electrodes 2 can be completed in such a way that no solder overflows into the surroundings of the electrodes 2 (FIG. 13C).

In this embodiment, the solder 5 is used for connecting the semiconductor element 1 and the wiring substrate 51. However, use may well be made of a conductive resin material, especially, a single liquid epoxy resin in which Ag or metal particles containing 1~5 wt % Pd in Ag are mixed.

Where the solder is used for connecting the semiconductor element 1 and the wiring substrate 51, that is, for connecting the metal projection 4 and the wiring substrate 51, it is necessary to use, as the material of the metal projection 4, a metal which is effective in preventing the diffusion of solder and effectively adhesive to solder such as copper. However, when a conductive resin material is used for connecting the semiconductor element 1 and the wiring substrate 51, there is no such necessity and, for example, Au may be used for the metal projection 4. Also, the conductive resin may touch, for example, the Al electrode of the semiconductor element 1. Also, if the electrode of the semiconductor element 1 were made of material which would have solder diffusion prevention properties such as in the case of copper, no problem arises when the solder 5 provided on the metal projection 4 touches its electrode.

The embodiment described above has shown that the bump structure is provided on the electrodes of the semiconductor element, hence the substrate is semiconductor. However, it is to be noted that this can be applied to the bump structure provided on an electrode of, for example, ceramic substrates.

FIGS. 14A–14D show, in diagrammatic sectional views, a bump structure of a second embodiment according to the invention.

On an Al electrode 2 of the semiconductor chip 1, there are formed a first bump 6a which is constituted by a metal such as Au, Cu, Pd and Ni and has a projected portion 4a at a top portion thereof and a second bump 6b which is provided on the first bump 6a and is constituted by a conductive resin material or solder. The first bump 6a has a diameter of 50~80 μm and a height at a portion excepting the projected portion 4a is 30~50 μm. The shape of the first bump 6a, excepting the projected portion, is substantially spherical as shown in FIG. 14C, and the projected portion 4a is located at a center portion on a top surface of the first bump 6a. The projected portion 4a is surrounded by a flat annular plane 4b. The projected portion 4a has a diameter ranging between 20~40 μm and a height ranging between 10~30 μm.

Figure 14A:
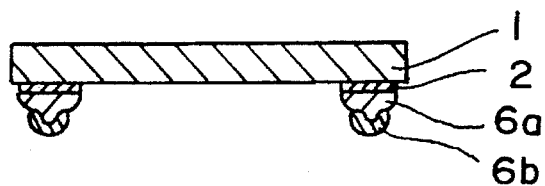
FIGS. 14A–14D are diagrams for showing a second embodiment of a bump structure according to the invention and its application, FIG. 14A being a diagrammatic sectional view for showing an application of the bump structure of this embodiment, FIG. 14B being a diagrammatic sectional view for showing a state in which the structure shown in FIG. 14A is connected to a wiring substrate, FIG. 14C being an enlarged perspective view of a portion of a first bump shown in FIG. 14A, and FIG. 14D being an enlarged perspective view of a portion of a second bump shown in FIG. 14A.
Figure 14B:
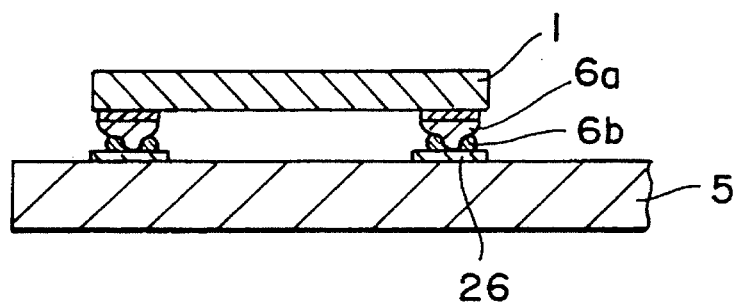
Figure 14C:
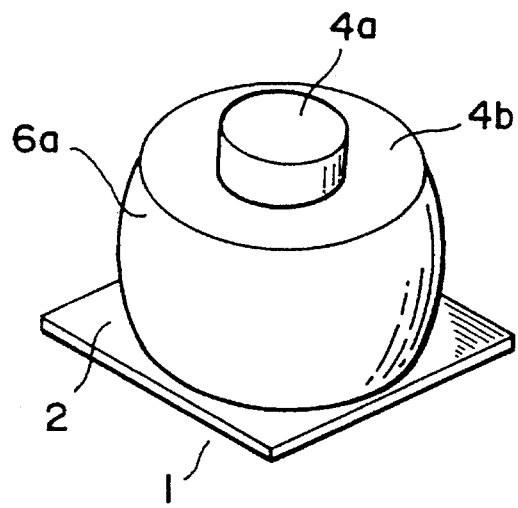
Figure 14D:
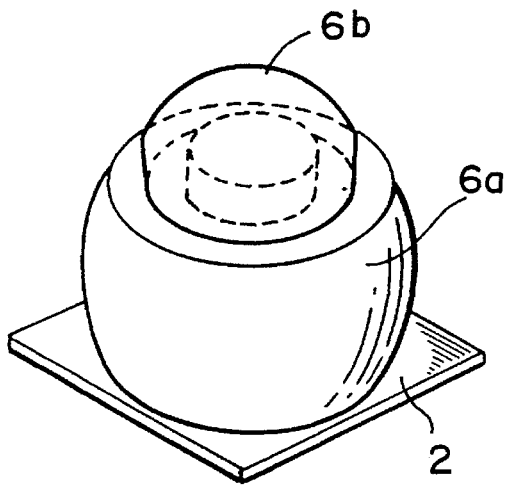

The second bump 6b is formed, as shown in FIG. 14D, on the donut shaped flat annular plane 4b of the first bump 6a such that the projected portion 4a of the first bump 6a is covered completely. The volume of the second bump 6b is smaller than that of the first bump 6a, and the diameter of the second bump 6b is 40~80% of the diameter of the first bump 6a.

FIG. 14B is a diagrammatic sectional view showing a state in which the semiconductor chip 1 is mounted on a wiring substrate 5, especially the state of the bump structure. The semiconductor chip 1 is aligned with the wiring substrate 5 which is made of glass epoxy or ceramic, and is connected to the wiring substrate 5 through the bump structure. The second bump 6b is deformed as being pressed onto a substrate electrode 26. This deformation of the second bump 6b absorbs the variations in the amounts of space between the semiconductor chip 1 and the wiring substrate 5 that are caused by any variations in heights of the first bumps 6a or any warping of the wiring substrate 5, thereby enabling to attain the connection between the bump structure on the semiconductor chip 1 and the substrate electrode 26. The second bump 6b is contracted in a direction of its height and, due to the resulting deformation thereof, the diameter of the first bump 6a after the connection to the wiring substrate 5 becomes larger than before the connection. However, since the diameter of the second bump 6b is made smaller than the diameter of the first bump 6a in the first place, the diameter of the second bump 6b after the deformation remains within the extent of the diameter of the first bump 6a, so that no short-circuiting occurs with the adjacently located Al electrode 2 and the substrate electrode 26.

Where the second bump 6b is made of a conductive resin material, the second bump 6b is, after being connected to the substrate electrode 26, heated and cured for attaining an electric connection. The conductive resin material used is, for example, an epoxy resin material such as 1085X, a product of Sumitomo Bakelite Company, Limited., in which are dispersed such metal particles as Ag powder, AgPd alloy powder, Pd plated Ag powder, and Pd plated Ni powder. Alternative to the conductive resin material, solder can be used. The solder may be of SnPb, SnPbAg, SnAg, PbIn, etc. In the case of the solder, during the mounting operation, the wiring substrate 5 is heated to melt the solder for accomplishing the connection to the wiring substrate 5.

FIG. 15 is a diagram, partially in sectional view, showing a device used for forming the second bump 6b on the first bump 6a, and FIGS. 16A, 16B and 16C are diagrams, partially in sectional views, showing sequential steps in a process for forming the bump structure. Here, the example is one in which the second bump uses a conductive resin material.

The conductive resin material 25 which is a material for the second bump 6b is in a liquid form filling inside the resin material container 8. At the height of the liquid surface, there is fixed a metal mask 10 having round openings 9 each of which is located at the same position as the first bump 6a of the semiconductor chip 1 and has a diameter smaller than that of the first bump 6a but large enough to allow the projected portion 4a to pass through. The resin material container 8 has, at a bottom thereof, inlet openings 11 for the conductive resin material 25 to be supplied thereto. The inlet openings 11 are connected to a syringe 12 which contains the conductive resin material 25 to be supplied to the resin material container 8. The supplying of the conductive resin material 25 is controlled by a dispenser 13.

Now, the sequential steps in the process of forming the bump structure is explained. The process of forming the first bump is the same as that for the prior art technique in which a ball bonding technique using wires of, for example, copper, is used. Thus, explanation for that aspect of the process is omitted here.

As shown in FIG. 16A, in the state wherein the Al electrode 2 is brought to the position in alignment with the opening 9, the semiconductor chip 1 is moved down so that the first bump 6a is caused to be pressed to the opening 9 of the metal mask 10 and the projected portion 4a of the first bump 6a is caused to be inserted into the opening 9 (FIG. 16B). Then, the semiconductor chip 1 is raised, whereby the second bump 6b of the conductive resin material 25 is formed on the projected end of the first bump 6a (FIG. 16C). The amount of the conductive resin material 25 used for the second bump 6b is filled up under the control by the dispenser 13 so that the conductive resin material container restores to the original state (FIG. 16A).

Where the solder is used in place of the conductive resin material 25, the solder contained in the container being provided with a metal mask having an opening in the same way as in FIG. 15 is melt by a heater, and the same steps as those illustrated in FIGS. 16A–16C are followed for the formation of the second bump.

Another process for forming the second bump 6b on the first bump 6a is illustrated in FIGS. 17A–17C. The device shown in FIG. 15 is used and, through the dispenser 13, the conductive resin material 25 in the syringe 12 and the resin material container 8 is given a pressure, whereby a protuberance 15 of the conductive resin material 25 is formed at the opening 9 of the metal mask 10 (FIG. 17A). The position of the Al electrode 2 is set in alignment with that of the opening 9, and the semiconductor chip 1 is moved down thereby causing the first bump 6a to be pressed to the resin material protuberance 15 and the projected portion 4a of the first bump 6a to be dipped into the resin material protuberance 15 (FIG. 17B). Then, the semiconductor chip 1 is raised, whereby the second bump 6b of the conductive resin material 25 is formed on the projected end of the first bump 6a (FIG. 17C). The level of the conductive resin material 25 becomes low correspondingly to the amount of the conductive resin material 25 used for the second bump 6b, but the conductive resin material 25 restores to the original state due to a pressure from the dispenser 13 (FIG. 17A). In this method, solder can be used in place of the conductive resin material 25.

In the semiconductor device according to the invention, the diameter of the second bump 6b formed on the first bump 6a carried by the Al electrode 2 of the semiconductor chip 1 is 40~80% the diameter of the first bump 6a with the potential contact pitch of the second bump 6b with respect to adjacent electrodes being smaller than that of the first bump 6a or the Al electrode 2. Thus, when the semiconductor chip 1 is connected to the substrate electrode and the second bump 6b is deformed, the short-circuiting which may otherwise develop between the adjacent electrodes does not occur, and this permits narrow-pitch connections of the electrodes.

Figure 19A:
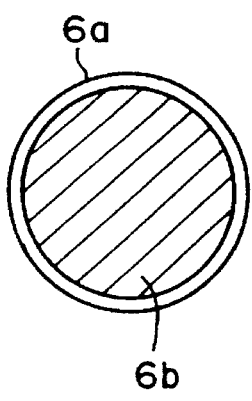
FIGS. 19A–19C are enlarged plane views showing the first bump in the fixed same size and the second bumps in varied sizes in the second embodiment shown in FIGS. 14A–14D.
Figure 19B:
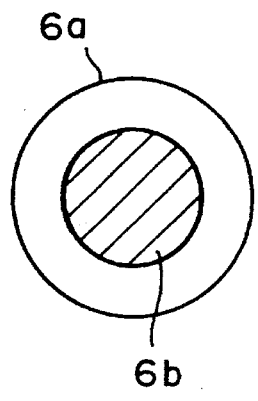
Figure 19C:
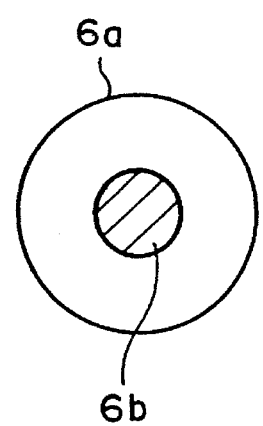

Now, explanation is made with some detailed data. FIG. 18 shows the relationship that the diameters of the second bump 6b of the semiconductor chip 1 have with a peel strength and a short-circuiting occurrence rate. FIGS. 19A, 19B and 19C show respective enlarged plane views of the first bump 6a and the second bump 6b where the sizes of the second bump 6b are different from one another. In the example shown in FIG. 19A, the diameter of the second bump 6b is 90% the diameter of the first bump 6a and, in this case, as seen in FIG. 18, the peel strength per bump is sufficient but there is a possibility for the short-circuiting to occur with the adjacently located electrodes.

In the example shown in FIG. 19B, the diameter of the second bump 6b is 50% the diameter of the first bump 6a and, in this case, according to FIG. 18, the peel strength is somewhat weaker compared with that in FIG. 19A but the value thereof is sufficient for practical need and the short-circuiting does not occur. In the example shown in FIG. 19C, the diameter of the second bump 6b is 30% the diameter of the first bump 6a and, in this case, according to FIG. 18, the short-circuiting does not occur but the peel strength is insufficient. Thus, the foregoing indicates that the appropriate range of the diameter of the second bump 6b is 40~80% the diameter of the first bump 6a.

While the invention has been described in its preferred embodiments, it is to be understood that the words which have been used are words of description rather than limitation and that changes within the purview of the appended claims may be made without departing from the true scope of the invention as defined by the claims.

What is claimed is:

1. A bump structure comprising:

a first bump made of a conductive material, a first surface of which is fixed to an electrode of a substrate, and which is substantially spherical and has a projected portion at a center portion on a second surface thereof;

said second surface being on the opposite side of said first bump from said first surface; and a second bump made of a conductive material having a diameter less than that of said first bump, and covering said projected portion on said first bump, but not touching said electrode;

said first bump being made of a metal having properties of preventing said second bump from diffusing and of adhering to said second bump.

2. The bump structure according to claim 1, in which said first bump has a cylindrical projected portion at the center portion on the second surface thereof.

3. The bump structure according to claim 1, in which said first bump has a conical projected portion at the center portion on the second surface thereof.

4. The bump structure according to claim 1, in which said first bump is made of a material selected from the group consisting of copper and a metal whose main composition is copper.

5. The bump structure according to claim 1, in which said first bump is made of a material selected from the group consisting of palladium and a metal whose main composition is palladium.

6. The bump structure according to claim 1, in which said second bump has a diameter smaller than an outer diameter of said first bump.

7. A bump structure comprising:

a first bump made of a conductive material, a first surface of which is fixed to an electrode of a substrate, and which is substantially spherical and has a projected portion at a center portion on a second surface thereof;

said second surface being on the opposite side of said first bump from said first surface; and a second bump made of a conductive material, and covering said projected portion on said first bump, but not touching said electrode;

wherein said second bump has the diameter which is 40%–80% of the diameter of said first bump.

8. The bump structure according to claim 1, in which said second bump is made of solder.

9. The bump structure according to claim 1, in which said second bump is made of conductive resin material.

10. The bump structure according to claim 1, in which said electrode is made of one of an aluminum electrode and an aluminum compound metal electrode.

11. The bump structure according to claim 1, in which said substrate is a semiconductor chip.

12. A flip-chip connecting structure comprising:

a first bump made of a conductive material, a first surface of which is fixed to a first electrode of a first substrate, and which is substantially spherical and has a projected portion at a center portion on a second surface thereof, said second surface being on the opposite side of said first bump from said first surface; and a second bump made of a conductive material having a diameter less than that of said first bump, and being configured such that it interconnects said second electrode and said first bump but does not touch said first electrode;

said first bump being made of a metal having properties of preventing said second bump from diffusing and of adhering to said second bump.

13. The flip-chip connecting structure according to claim 12, in which said first bump has a cylindrical projected portion at the center portion on the second surface thereof.

14. The flip-chip connecting structure according to claim 12, in which said first bump has a conical projected portion at the center portion on the second surface thereof.

15. The flip-chip connecting structure according to claim 12, in which said first bump is made of a material selected from the group consisting of copper and a metal whose main composition is copper.

16. The flip-chip connecting structure according to claim 12, in which said first bump is made of a material selected from the group consisting of palladium and a metal whose main composition is palladium.

17. The flip-chip connecting structure according to claim 12, in which said second bump has a diameter smaller than an outer diameter of said first bump.

18. A flip-chip connecting structure comprising:

a first bump made of a conductive material, a first surface of which is fixed to a first electrode of a first substrate, and which is substantially spherical and has a projected portion at a center portion on a second surface thereof, said second surface being on the opposite side of said first bump from said first surface; and a second bump made of a conductive material, and being configured such that it interconnects said second electrode and said first bump but does not touch said first electrode;

wherein said second bump has the diameter which is 40%–80% of the diameter of said first bump.

19. The flip-chip connecting structure according to claim 12, in which said second bump is made of solder.

20. The flip-chip connecting structure according to claim 12, in which said second bump is made of conductive resin material.

* * * * *

UNITED STATES PATENT AND TRADEMARK OFFICE
CERTIFICATE OF CORRECTION

PATENT NO. : 5,508,561
DATED : April 16, 1996
INVENTOR(S) : Masamoto Tago, et. al.

It is certified that error appears in the above-indentified patent and that said Letters Patent is hereby corrected as shown below:

| | |
|---|---|
| Column 1, | line 50, delete "A1" and insert --Al--. |
| Column 2, | line 15, delete "A1" and insert --Al--; |
| | line 52, delete "A1" and insert --Al--. |
| Column 3, | line 45, delete "A1" and insert --Al--. |
| Column 4, | line 65, delete "A1" and insert --Al--. |
| Column 7, | line 14, delete "A1" and insert --Al--; |
| | line 23, delete "A1" and insert --Al--; |
| | line 31, delete "A1" and insert --Al--; |
| | line 35, delete "A1" and insert --Al--; |
| | line 41, delete "A1" and insert --Al--; |
| | line 51, delete "A1" and insert --Al--. |
| Column 8, | line 27, delete "A1" and insert --Al--; |
| | line 58, delete "A1" and insert --Al--. |
| Column 9, | line 24, delete "A1" and insert --Al--; |
| | line 39, delete "A1" and insert --Al--. |
| Column 10, | line 17, delete "A1" and insert --Al--; |
| | line 60, delete "A1" and insert --Al--. |
| Column 11, | line 19, delete "A1" and insert --Al--; |
| | line 36, delete "A1" and insert --Al--; |
| | line 40, delete "A1" and insert --Al--. |

UNITED STATES PATENT AND TRADEMARK OFFICE
CERTIFICATE OF CORRECTION

PATENT NO. : 5,508,561
DATED : April 16, 1996
INVENTOR(S) : Masamoto Tago, et. al.

It is certified that error appears in the above-indentified patent and that said Letters Patent is hereby corrected as shown below:

Column 12, line 15, delete "thereof" and insert --of said first bump;
line 28, delete "thereof" and insert --of said first bump--;
line 31, delete "thereof" and insert --of said first bump--;
line 47, delete "thereof" and insert --of said first bump--.

Column 13, line 2, delete "thereof" and insert --of said first bump--;
line 15, delete "thereof" and insert --of said first bump--;
line 18, delete "thereof" and insert --of said first bump--.

Column 14, line 9, delete "thereof" and insert --of said first bump--.

Signed and Sealed this

Thirtieth Day of July, 1996

Attest:

BRUCE LEHMAN

Attesting Officer    Commissioner of Patents and Trademarks